(12) United States Patent
Chen et al.

(10) Patent No.: US 8,779,538 B2
(45) Date of Patent: Jul. 15, 2014

(54) MAGNETIC TUNNELING JUNCTION SEED, CAPPING, AND SPACER LAYER MATERIALS

(75) Inventors: Eugene Youjun Chen, Fremont, CA (US); Xueti Tang, San Jose, CA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/491,568

(22) Filed: Jun. 7, 2012

(65) Prior Publication Data

US 2014/0008742 A1 Jan. 9, 2014

Related U.S. Application Data

(63) Continuation-in-part of application No. 12/776,331, filed on May 7, 2010, which is a continuation-in-part of application No. 12/538,489, filed on Aug. 10, 2009.

(51) Int. Cl.
| | |
|---|---|
| H01L 27/22 | (2006.01) |
| H01L 29/04 | (2006.01) |
| H01L 47/00 | (2006.01) |
| G11B 5/33 | (2006.01) |
| G11B 5/127 | (2006.01) |

(52) U.S. Cl.
USPC ................................ 257/427; 257/3; 360/324

(58) Field of Classification Search
USPC ................................ 257/3, 421–427; 360/324
See application file for complete search history.

(56) References Cited

U.S. PATENT DOCUMENTS

| | | | |
|---|---|---|---|
| 6,754,054 B2 * | 6/2004 | Seigler et al. ............. | 360/324.11 |
| 6,992,359 B2 * | 1/2006 | Nguyen et al. ................ | 257/421 |
| 8,124,253 B2 | 2/2012 | Nishimura et al. | |
| 2004/0008454 A1 * | 1/2004 | Gill ............................ | 360/324.12 |
| 2005/0254286 A1 * | 11/2005 | Valet .............................. | 365/158 |
| 2005/0264950 A1 * | 12/2005 | Gill ............................ | 360/324.11 |
| 2008/0186758 A1 * | 8/2008 | Shen et al. ..................... | 365/158 |
| 2009/0154029 A1 | 6/2009 | Iwasaki | |
| 2009/0162698 A1 * | 6/2009 | Fukuzawa et al. ......... | 428/811.2 |
| 2009/0269617 A1 * | 10/2009 | Zhang et al. ............... | 428/811.1 |
| 2011/0031569 A1 | 2/2011 | Watts et al. | |
| 2011/0032644 A1 | 2/2011 | Watts et al. | |
| 2011/0140762 A1 | 6/2011 | Jiang et al. | |

FOREIGN PATENT DOCUMENTS

JP 2007305610 11/2007

OTHER PUBLICATIONS

Liu et al., "Spin-Torque Switching with the Giant Spin Hall Effect of Tantalaum", Science 336, 555 (2012), 5 pages.
Nowak et al., "Demonstration of Ultralow Bit Error Rates for Spin-Torque Magnetic Random-Access Memory with Perpendicular Magnetic Anisotropy", IEEE Magnetics Letters, vol. 2 (2011), 4 pages.
Sato, et al., "Junction size effect on switching current and thermal stability in CoFeB/MgO perpendicular magnetic tunnel junctions", Applied Physics Letters 99, 042501 (2011), 3 pages.

* cited by examiner

Primary Examiner — Karen Kusumakar
(74) Attorney, Agent, or Firm — Renaissance IP Law Group LLP (57) ABSTRACT

In one embodiment, a magnetic element for a semiconductor device includes a reference layer, a free layer, and a nonmagnetic spacer layer disposed between the reference layer and the free layer. The nonmagnetic spacer layer includes a binary, ternary, or multi-nary alloy oxide material. The binary, ternary, or multi-nary alloy oxide material includes MgO having one or more additional elements selected from the group consisting of: Ru, Al, Ta, Tb, Cu, V, Hf, Zr, W, Ag, Au, Fe, Co, Ni, Nb, Cr, Mo, and Rh.

23 Claims, 10 Drawing Sheets

MAGNETIC TUNNELING JUNCTION SEED, CAPPING, AND SPACER LAYER MATERIALS

CROSS-REFERENCE TO RELATED APPLICATIONS

The present application is a continuation-in-part of co-pending patent application Ser. No. 12/776,331, filed May 7, 2010, entitled "Method and System for Providing Magnetic Tunneling Junction Elements Having Improved Performance Through Capping Layer Induced Perpendicular Anisotropy and Memories Using Such Magnetic Elements," which is a continuation-in-part of co-pending patent application Ser. No. 12/538,489, filed Aug. 10, 2009, entitled "Method and System for Providing Magnetic Tunneling Junction Elements Having Improved performance Through Capping Layer Induced Perpendicular Anisotropy and Memories Using Such Magnetic Elements", the disclosures of each of which are incorporated herein by reference in their entireties.

GOVERNMENT RIGHTS

This invention was made with U.S. Government support under Grant/Contract No. HR0011-09-C-0023 awarded by DARPA. The U.S. Government retains certain rights in this invention.

BACKGROUND

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information-recording medium. One type of MRAM is a spin transfer torque random access memory (STT-RAM). STT-RAM utilizes magnetic elements written at least in part by a current driven through the magnetic element.

Figure 1:
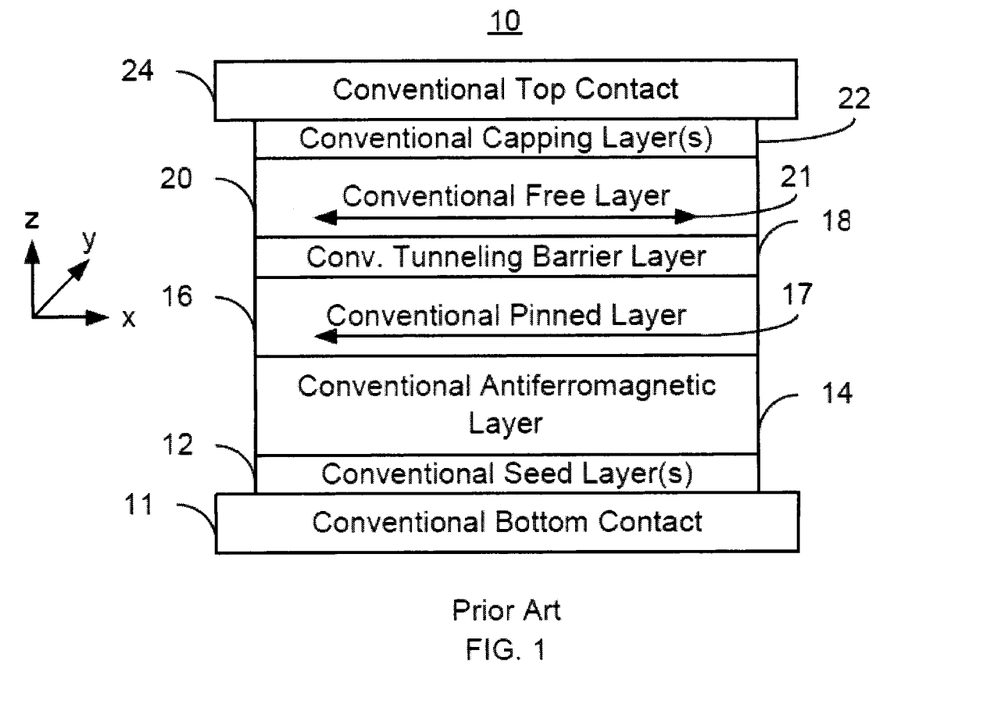
FIG. 1 depicts a conventional magnetic element.

For example, FIG. 1 depicts one exemplary magnetic tunneling junction (MTJ) 10 as it may be used in a conventional STT-RAM. The conventional MTJ 10 is typically formed over a bottom contact 11, uses conventional seed layer(s) 12 and includes a pinning layer, e.g., a conventional antiferromagnetic (AFM) layer 14, a conventional pinned layer (or a reference layer) 16, a conventional tunneling barrier layer 18, a conventional free layer 20, and a conventional capping layer 22. Also shown is a top contact 24.

Conventional contacts 11 and 24 are used in driving the current in a current-perpendicular-to-plane (CPP) direction, or along the z-axis as shown in FIG. 1. The conventional tunneling barrier layer 18 is nonmagnetic and is, for example, a thin insulator such as MgO. The conventional seed layer(s) 12 are typically utilized to aid in the growth of subsequent layers, such as the AFM layer 14, having a desired crystal structure. Direct exposure of the conventional free layer 20 to the top contact 24 may result in a disordered interface, dead magnetic regions and enhanced damping. Consequently, the conventional capping layer 22 is provided directly on the free layer 20, prior to deposition of the top contact 24. This conventional cap acts as a diffusion block and improves the surface quality of the conventional free layer 20. The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically or ferromagnetically coupled through thin conductive layers, such as Ru. In such a SAF, multiple magnetic layers interleaved with a thin layer of Ru may be used.

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru.

Spin transfer torque may be used to write to the conventional MTJ 10. In particular, spin transfer torque rotates the magnetization 21 of the conventional free layer 20 to one of the two directions along its easy axis. When a write current is passed through the conventional MTJ 10 perpendicular to the plane of the layers, electrons may be spin polarized by transmission through or reflection from the conventional pinned layer 16. The spin transfer torque on the magnetization 21 of the conventional free layer 20 may be adequate to switch the conventional free layer 20 if a sufficient current is driven through the conventional MTJ 10. Therefore, the conventional free layer 20 may be written to the desired state. The conventional MTJ 10 may thus be used for data storage in an STT-RAM.

SUMMARY

In exemplary embodiments, a binary alloy oxide, ternary alloy oxide, or other multi-nary alloy oxide, which has the same basic crystal orientation (001) as MgO after annealing, can be provided to lower the barrier height of MgO so that it is less resistive at increased thicknesses. For instance, new oxides can be formed by providing additional elements to the oxide, e.g., MgO to reduce its resistance. These additional elements can include, for instance, any one or more of the following elements: Ru, Al, Ta, Tb, Cu, V, Hf, Zr, W, Ag, Au, Fe, Co, Ni, Nb, Cr, Mo, and Rh. The new oxides may be used as seed, capping, or spacer/barrier layers to increase the tunnel magnetoresistance (TMR) ratio and reduce the RA for the magnetic device such as a magnetic memory device.

The properties of the MgO layer can therefore be improved through the use of additives or additional elements. Additives can be used, for instance, to stretch or shrink the crystal structure to match the lattice constant. Or, additives can be used to increase mismatch caused strain impact on perpendicular anisotropy.

These new oxide materials provide a lower RA value by virtue of having a lower band gap or, in some instances, conductivity. A lower band gap reduces the material's resistance to tunneling. Conductive oxide materials could be used, for instance, for providing seed or capping layers with reduced resistance. And, although conductivity should generally be avoided for barrier layers in spin transfer torque MTJ structures, conductive spacer (insertion) layers can be useful for spin valve structures. By utilizing new oxide materials with reduced RA values for the seed, capping, and barrier/spacer layers, memory writing current and power can be reduced, read signal and speed can be increased, and the probability of writing and reading errors can be greatly reduced.

DETAILED DESCRIPTION

The exemplary embodiments relate to magnetic elements usable in magnetic devices, such as magnetic memories, and the devices using such magnetic elements. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular magnetic elements and magnetic memories having certain components. One of ordinary skill in the art will readily recognize that the present invention is consistent with the use of magnetic elements and magnetic memories having other and/or additional components and/or other features not inconsistent with the present invention. The method and system are also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic elements having particular layers. However, one of ordinary skill in the art will readily recognize that magnetic elements having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements. Further, as used herein, "in-plane" is substantially within or parallel to the plane of one or more of the layers of a magnetic element. Conversely, "perpendicular" corresponds to a direction that is substantially perpendicular to one or more of the layers of the magnetic element.

As discussed, an MTJ element such as the MTJ 10 of FIG. 1 may include an MgO tunneling barrier layer. MgO typically has a (001) ("rock salt") crystal structure that provides a good crystal structure match with bcc (001) CoFe, or with CoFeB following annealing. This good crystal structure match provides a higher tunneling magnetoresistance (TMR) ratio suitable for memory device applications, for example. Among other things, a high TMR ratio (e.g., >100%) enables faster read operations. And the symmetry filtering enhanced spin polarization results in a reduction of spin transfer torque (STT) critical switching current density.

The trend toward smaller devices, however, makes it desirable to reduce the RA of the MTJ. To do so, one approach has been to reduce the thickness of the MgO barrier layer. Unfortunately, however, when the MgO layer is too thin, its benefits may be lost. In particular, below about a 5-10 $\Omega\mu m^2$ RA value, the barrier quality quickly degrades and the TMR ratio decreases. For 20 nm circles, an RA value of 10 $\Omega\mu m^2$ will cause the MTJ bit to have a resistance of about 32 k$\Omega$. A high MTJ bit resistance will cause the write voltage $V_w$ and write energy $E_w$ to be detrimentally high.

Accordingly, it is desirable to have an improved tunneling barrier layer that has the same or similar effect as MgO, but has a lower barrier height to provide a low RA without making the barrier layer so thin that the film quality begins to degrade. A lower RA is desirable, for instance, to scale a PMTJ (perpendicular MTJ) based STT-RAM below a 20 nm node.

In addition, for best crystal structure matching, which might be desirable for obtaining the highest TMR ratio and the lowest spin transfer torque switching current density, a thin MgO layer may be used as a seed layer, a capping layer, or a spacer (insertion) layer. These layers have various desirable functions. For example, they can help to reduce the voltage drop over the MTJ during switching. A conventional capping layer, for instance, can help prevent oxidation of the magnetic materials (e.g., Ta) which can otherwise react and create a magnetic dead layer. With the MgO capping layer, the formation of a dead layer can be prevented and strong perpendicular interfacial anisotropy can be achieved. Unfortunately, however, providing an additional MgO layer may add a series resistance that can ultimately lower the TMR ratio by providing too much resistance.

Accordingly, it would also be desirable to have a seed, capping, and/or spacer (insertion) layer having a good crystal structure match with a much lower RA value to reduce performance degradation that might otherwise occur.

Furthermore, in some memory structures, for example, shown in FIG. 2, when MgO is used as the only tunneling barrier layer, seed layer(s), and capping layer(s), the resulting memory 100 may suffer from several writing and reading performance problems as described further below.

Figure 2:
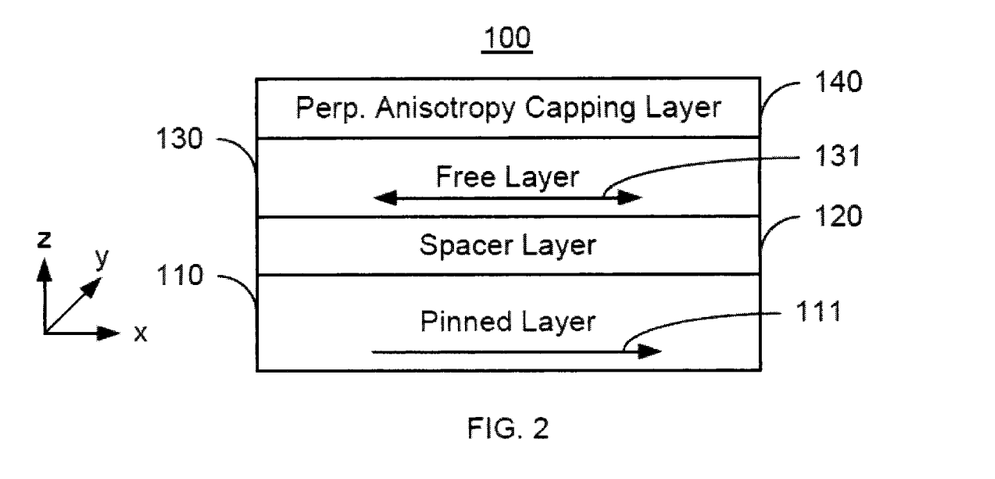
FIG. 2 depicts an exemplary magnetic element.

In FIG. 2, the memory 100 includes a perpendicular anisotropy capping layer 140, a free layer 130 having a changeable magnetization 131, and a spacer layer 120, (e.g., tunneling barrier), and a pinned layer 110. The magnetic element 100 is for use in a magnetic device, such as a magnetic memory, in which current is to be driven through the magnetic element 100. Consequently, such a device may include contacts (not shown in FIG. 2) through which current would be provided to and exit from the magnetic element 100. Such contacts may also be included in some or all of the devices discussed further below, for example, with respect to FIGS. 7-16, although not shown. The magnetic elements of the present application may also include other components not shown in FIG. 2. For example, in addition to seed layers, the magnetic elements may include an AFM layer (not shown) adjoining the pinned layer 110 for pinning the magnetization 111 of the pinned layer 110.

In the embodiment shown in FIG. 2, spin transfer torque may be used to switch the magnetization 131 of the free layer 130 to be parallel (P) or antiparallel (AP) to the magnetization 111 of the pinned layer 110. In the hard to switch (e.g., P→AP) direction, the required median switching current is approximately twice as much as in the easy to switch (e.g., AP→P) direction. Furthermore, due to supply current limitations from the cell transistor (e.g., 414 of FIG. 17) when the cell size is comparable to a DRAM cell size in the same technology node, the switching time for all MTJ bits to switch can be orders of magnitude longer, resulting in a slow writing operation that is not competitive with other memory technologies. Even in the easy to switch direction, when the memory 100 is written thousands to millions of times, more and more bad MTJ bits develop, become un-switched during some writing cycles, and then become good again. This is because a MTJ bit when switched by a spin torque has an incubation period that varies over time, depending on its exact magnetization direction at the time the spin torque is applied. When MgO is used as seed and capping layers, it adds to a series resistance and lowers the reading signal, and thus decreases memory read speeds, which is explained further below.

Figure 3:
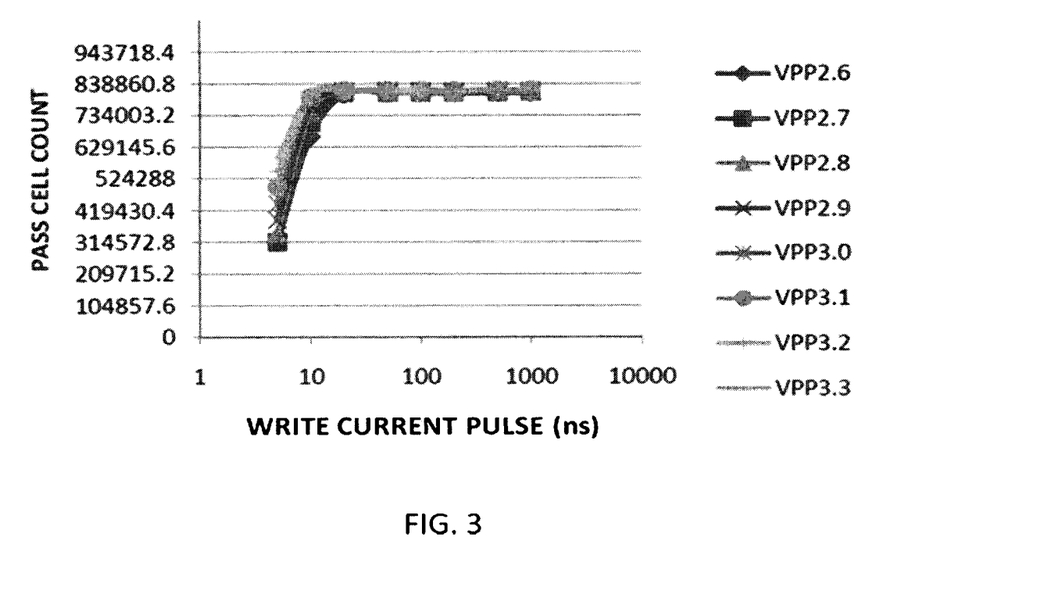
FIGS. 3 and 4 are graphs illustrating switching speeds at various voltages for the magnetic memory structures shown in FIG. 2 for the two switching directions.
Figure 4:
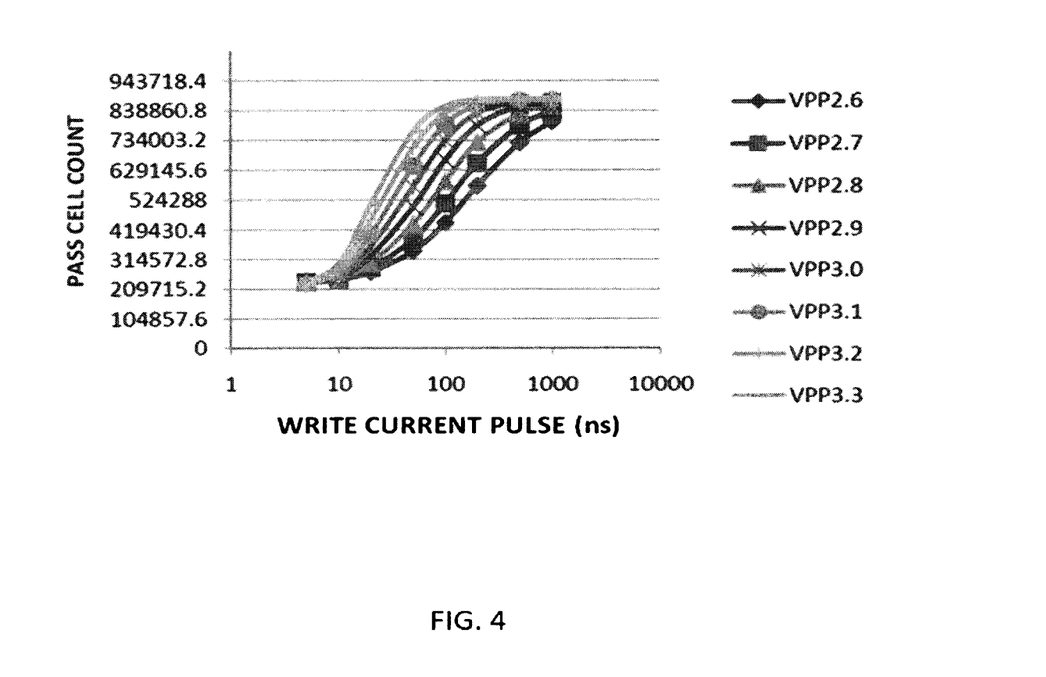
Figure 5:
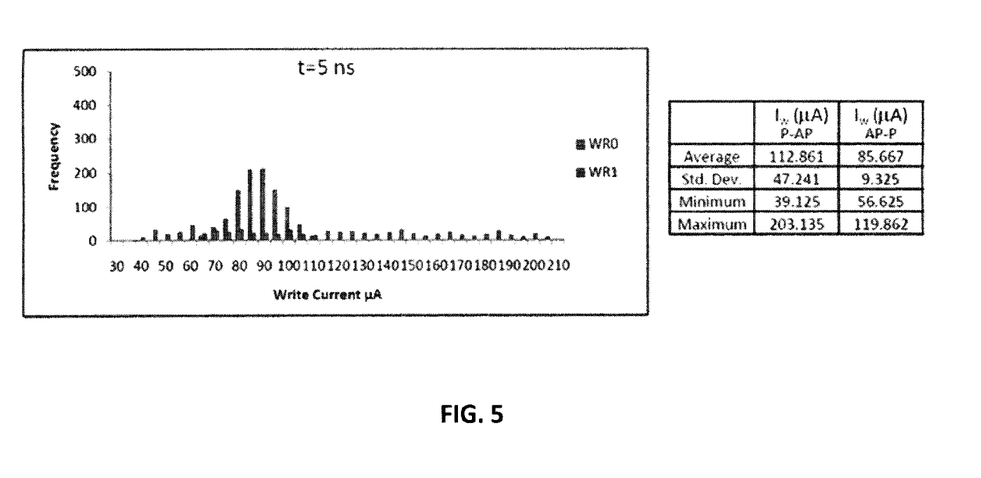
FIG. 5 is a graph illustrating the number of MTJ memory bits versus write current for the two switching directions (P→P, AP→P) in the structures shown in FIG. 2.

FIGS. 3 through 5 provide write operation performance data from the memory 100 when the MTJ 100 is constructed with MgO as a single tunneling barrier, and one or more of the seed and capping layers for the memory cell structure, such as in the device structure shown in FIG. 2.

Referring now to FIGS. 3 through 5, the problems with a write operation in a memory structure with only MgO forming the seed, capping, and the only barrier layer will now be discussed. FIG. 3 shows the single writing operation passing MTJ cell count versus writing pulse widths at various gate voltages applied to the cell transistor (Vpp). As shown in FIG. 3, the write speed (for all the good MTJ cells or bits to switch in a memory array) in the easy to switch direction (e.g., AP→P) can be as fast as 20 ns. However, as shown in FIG. 4, in the hard to switch direction (P→AP), the single write operation write speed can be slower than 500 ns for all the MTJ cells or bits to switch. The overall write speed may therefore be significantly reduced.

FIG. 5 illustrates the write current distribution for a write operation in both the easy to switch and hard to switch directions when the write pulse is fixed at 5 ns. As shown in FIG. 5, the write current required to program a cell in the hard to switch direction can also be much higher than the write current required to program a cell in the easy to switch direction. As illustrated, the average write current in the hard to switch direction is about 113 $\mu$A with a standard deviation of about 47 $\mu$A. In the easy to switch direction, however, the average write current is only about 86 $\mu$A with a standard deviation of only around 9 $\mu$A. Due to the broad distribution of write currents in the hard to switch direction, it would be difficult for a device constructed in this manner to function effectively.

Figure 6:
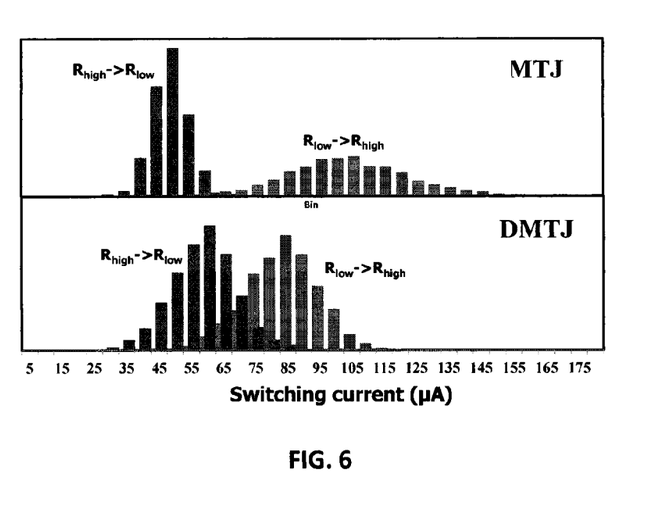
FIG. 6 provides a set of graphs illustrating the benefits of a DMTJ structure, and of a DMTJ structure in which one of the two barriers is configured according to principles of the present inventive concepts.

FIG. 6 is a graphical illustration comparing switching currents in a single barrier layer MTJ structure (such as a bottom MTJ structure) and in a DMTJ structure constructed according to some of the principles of the present inventive concepts (as shown, for example, in FIG. 7) overcoming the drawbacks of the devices discussed above.

Referring to FIG. 6, a single tunneling barrier layer has a concentrated switching current distribution in the easy to switch direction, but a broad distribution in the hard to switch direction. Using a DMTJ structure constructed according to some of the principles of the present inventive concepts, the distribution of switching current can be significantly reduced in the hard to write direction.

In addition, although a DMTJ structure using multiple MgO barrier layers may be capable of attaining fast switching speeds (e.g., 50 ns or less) in both directions, it can be prone to a low TMR ratio due to cancellation from both MgO barriers. This can result in a TMR ratio between 50% to 80% and RA larger than 20 $\Omega\mu m^2$, which is unsuitable for below 20 nm node applications.

Therefore, according to principles of the present inventive concepts, if instead of providing two MgO barriers, one (or both) of the barriers is replaced with a barrier formed from one or more of the new oxide materials disclosed in this application, the much lower RA new oxide material barrier will solve this problem by providing a much improved TMR ratio.

Figure 7:
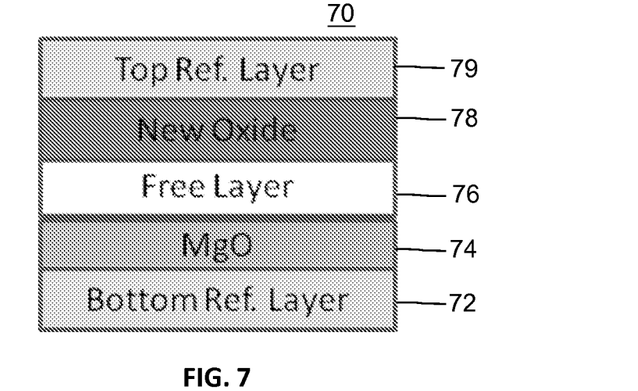
FIG. 7 is a schematic representation of a magnetic memory element constructed having a barrier layer formed from one or more of the new oxide materials according to principles of the present inventive concepts.

Referring now specifically to FIG. 7, a DMTJ structure according to one embodiment of the present inventive concepts is illustrated. In the DMTJ structure of this embodiment, one of the two barrier layers can be constructed from one or more of the new oxide materials rather than MgO.

In particular, in FIG. 7, a magnetic element 70 for use in a magnetic device, such as a magnetic memory, may include a pinned layer (or a bottom reference layer 72), a MgO spacer layer 74, a free layer 76, a non-magnetic spacer layer 78 formed of a new oxide material, and another pinned layer (or a top reference layer) 79. The new oxide material can be, for instance, a binary, ternary, or multi-nary alloy oxide with additional elements provided to reduce its resistance while retaining the same basic crystal orientation (001) as MgO after annealing. The magnetic orientation of the various magnetic layers can be either in plane or perpendicular. In some embodiments, the magnetic orientation of the various magnetic layers can be combinations of in-plane and perpendicular magnetic orientation.

More specifically, a binary alloy oxide can, for instance, be represented by the chemical formula $Mg_xA_yO_z$, where, for instance, $x+y+z=1$, $x>y$ and $0<x$, or $y$ or $z>1$. "A" represents an additional element added to the MgO. This element can, for instance, be any one of the following elements: Ru, Al, Ta, Tb, Cu, V, Hf, Zr, W, Ag, Au, Fe, Co, Ni, Nb, Cr, Mo, and Rh. While the typical barrier height of MgO is about 2-3 eV, with the additional element A, the barrier height may be reduced to below about 2 eV to provide a lower RA value. The binary alloy oxide $Mg_xA_yO_z$ still may have the (001) crystal structure of MgO.

Similarly, a ternary alloy oxide can, for instance, be represented by the formula $Mg_xA^1_{y1}A^2_{y2}O_z$, where, for instance, $x+y1+y2+z=1$, $x>y1+y2$, and $0<x$, or $y1$, $y2$, or $z<1$. $A^1$ and $A^2$ are elements added to MgO to achieve a barrier height lower than about 2 eV, to thereby lower the RA value. The ternary alloy oxide $Mg_xA^1_{y1}A^2_{y2}O_z$ still preferably has the (001) crystal structure of MgO.

A multi-nary alloy oxide can, for instance, be represented by the formula $Mg_xA^1_{y1}A^2_{y2}\ldots A^n_{yn}O_z$, where, for instance, $x+y1+y2+\ldots+yn+z=1$, and $0<x$ or $y1$, $y2$, \ldots, $yn$, or $z<1$. $A^1$, $A^2$, \ldots, $A^n$ are elements added to MgO to achieve a barrier height lower than about 2 eV to lower the RA value.

It should be noted, however, that in some embodiments, $x+y$ or $x+y1+\ldots+yn$ can be $>1$, and z can also be $>1$. For instance, any one or more of the materials $MgAl_2O_4$, $(Mg, Ca, Sr, Ba)SnO_3$, $Mg_2SnO_4$, or $NiMn_2O_4$ could be used as the new oxide material.

The new oxide materials can be formed, for instance, by sputtering a magnesium target with the desired additional element(s) and then exposing the sputtered film to oxygen. Alternatively, two, three, or more targets could be co-sputtered for binary, ternary, or multi-nary alloy oxides. Premixed targets could also be provided in which desired metals are premixed before sputtering and exposure to oxygen. Or, although the particle count might be too high for memory devices, the metals and oxygen could be premixed in one single target prior to sputtering. Although when used as a barrier layer the new oxide material should not be conductive, the new oxide material may be conductive when used for seed or capping layers or when used as a spacer layer in a spin valve structure.

Without the new oxide material being used for one or more of the MgO barrier layers, the TMR ratio would be lower because of series resistance of the MgO layers. By using one of the new oxide materials, a higher TMR ratio and enhanced spin polarization can be obtained.

FIGS. 8 through 16 illustrate further embodiments of magnetic stack structures for memory elements constructed according to principles of the present inventive concepts. In each of these embodiments, the reference layers can, for instance, be SAF structures for reducing or cancelling a bias field effect on the free layer. Also, the free layer can be a SAF structure.

Figure 8:
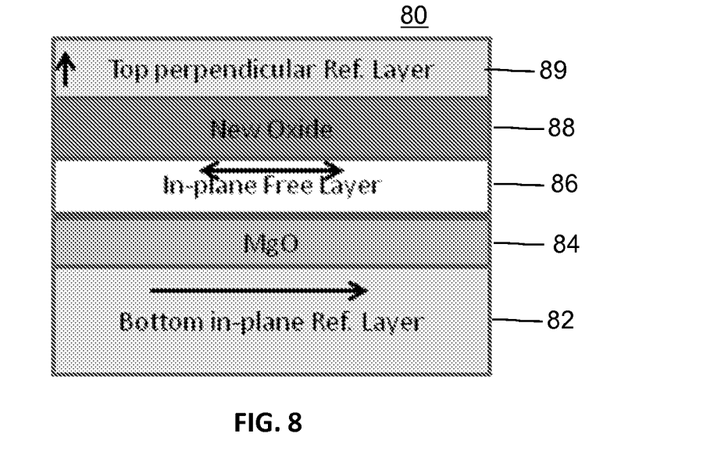
FIG. 8 is a schematic representation of a magnetic memory element having both in-plane and perpendicular reference layers, and further having an in-plane magnetized free layer and having a barrier layer formed from one or more of the new oxide materials according to principles of the present inventive concepts.

Referring to FIG. 8, a magnetic element or magnetic stack structure 80 can include a pinned layer (or a top reference layer) 89 having a perpendicular magnetic orientation (perpendicular magnetization) arranged over a free layer 86 having an in-plane magnetic orientation (in-plane magnetization) with a non-magnetic spacer layer (or tunneling barrier layer) 88 formed from one or more of the new oxide materials arranged between the free layer 86 and the top reference layer 89. Another pinned layer (or a bottom reference layer) 82 can be provided having an in-plane magnetic orientation with an MgO tunneling barrier layer formed between the bottom reference layer 82 and the free layer 86. This embodiment can provide very fast switching because of the combination of two spin torques from the bottom in-plane and top perpendicular reference layers. MgO may be used in this example as the main tunneling barrier layer to provide a higher R value. Thus, reading signals can be improved by the main MgO barrier having a higher TMR ratio for larger read signal and faster reading operation. When a writing current is passed through the MTJ structure shown in FIG. 8, the top perpendicular reference layer provides a large perpendicular spin torque on the free layer 86, and makes the free layer magnetization tilt out of the plane immediately, the spin torque from the bottom reference layer 82 will also act on the free layer magnetization, and point the magnetization of the free layer 86 to either parallel or antiparallel with the bottom reference layer 82. There will also be a precessional rotational effect of the free layer magnetization when it is tilted out of its film plane, thus making the switching of the free layer magnetization very fast (e.g., tens to hundreds of pico seconds).

Figure 9:
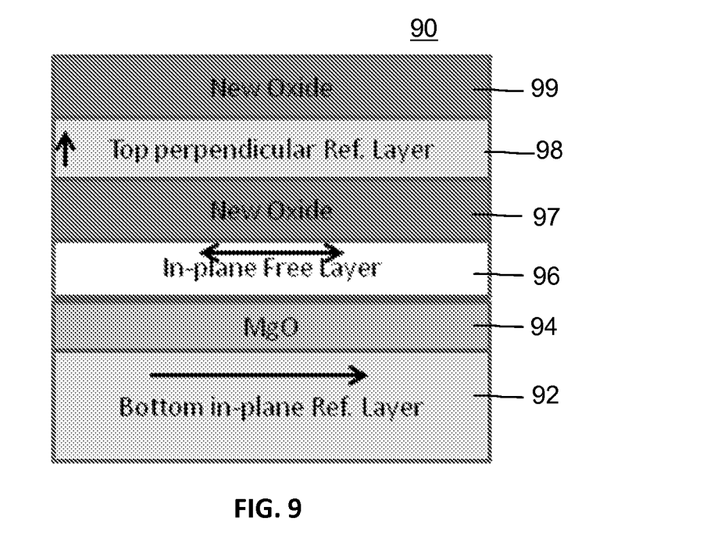
FIG. 9 is a schematic representation of a magnetic memory element similar to FIG. 8, but further including a capping layer formed from one or more of the new oxide materials according to additional principles of the present inventive concepts.

The embodiment shown in FIG. 9 is similar to that shown in FIG. 8, except a capping layer 99 formed from one or more of the new oxide materials is arranged above a pinned layer (or a top reference layer) 98. The new oxide material capping layer 99 can help induce additional interfacial perpendicular anisotropy in the top reference layer 98. It should be noted that in each of the previous embodiments and the later-described embodiments, the structures can be inverted without departing from the inventive principles described herein. A magnetic element 90 may also include an in-plane free layer 96, a bottom reference layer 92 with an MgO layer 94 disposed therebetween. A non-magnetic spacer layer (or tunneling barrier layer) 97 formed from one or more of the new oxide materials arranged between the free layer 96 and the top reference layer 98.

Figure 10:
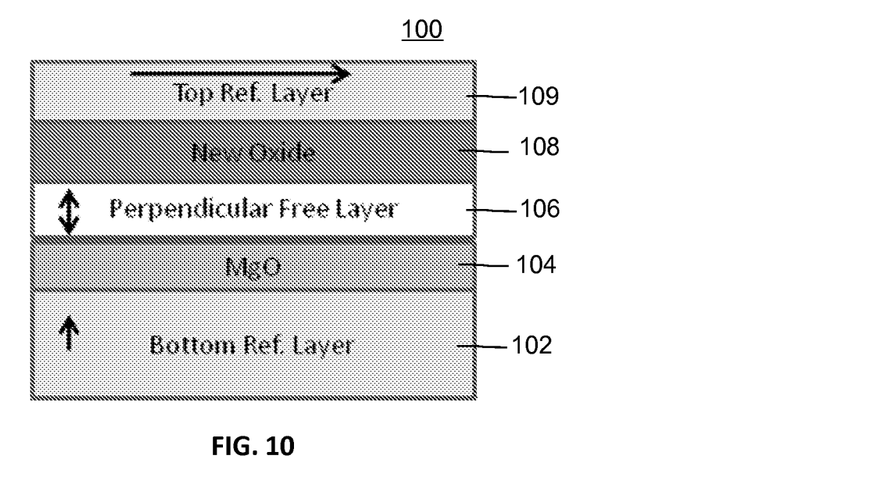
FIG. 10 is a schematic representation of a magnetic memory element having both perpendicular and in-plane reference layers, a perpendicularly magnetized free layer, and further having a barrier layer formed of one or more of the new oxide materials according to another embodiment of the present inventive concepts.

FIG. 10 illustrates a magnetic element (or a magnetic stack structure or MTJ) 100 in which the top reference layer 109 has an in-plane magnetic orientation, while the free layer 106 and the bottom reference layer 102 each have perpendicular magnetic orientations. A non-magnetic spacer layer or a tunneling barrier layer 108 formed from one or more of the new oxide materials may be arranged between the top reference layer 109 and the free layer 106, and an MgO tunneling barrier layer 104 may be arranged between the free layer 106 and the bottom reference layer 102. Perpendicular magnetic orientations can help reduce the size of the magnetic device to below 20 nm sizes because perpendicular magnetic materials have much larger magnetic anisotropy than in-plane magnetic materials. When a writing current is applied through the MTJ shown in FIG. 10, the in-plane reference layer 109 provides a maximum spin torque on the free layer to tilt its magnetization towards the in-plane direction, and in conjunction with the spin torque from the bottom perpendicular reference layer 102, the free layer will switch to be parallel or antiparallel with the bottom reference layer 102 in a short period. However, without the in-plane top reference layer 109, the initial spin torque may be zero or close to zero and it may take an undesirably long time to begin switching.

Figure 11:
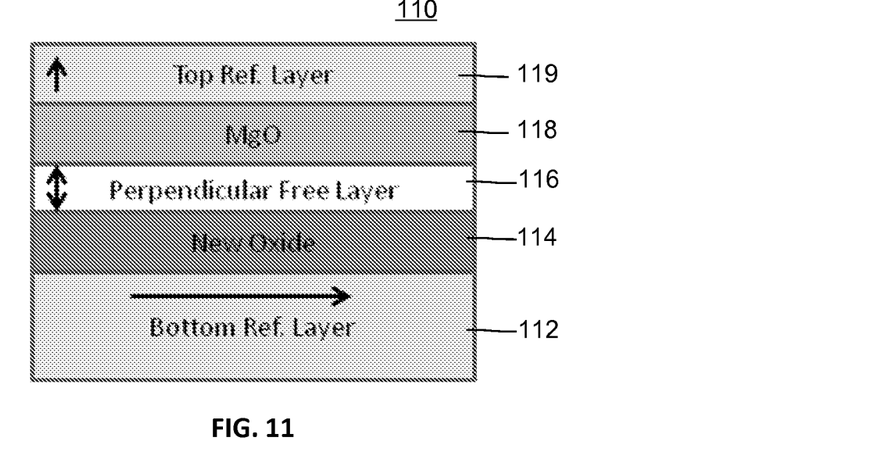
FIG. 11 is a schematic representation of another embodiment of a magnetic memory element having both perpendicular and in-plane reference layers, a perpendicularly magnetized free layer, and further having a barrier layer formed of one or more of the new oxide materials according to additional principles of the present inventive concepts.

FIG. 11 illustrates a magnetic element (or a magnetic stack structure or MTJ) 110 in which the top reference layer 119 and the free layer 116 have perpendicular magnetic orientations while the bottom reference layer 112 has an in-plane magnetic orientation. An MgO tunneling barrier layer 118 may be arranged between the top reference layer 119 and the free layer 116 while a non-magnetic spacer layer (or a tunneling barrier layer) 114 formed from one or more of the new oxide materials can be arranged between the free layer 116 and the bottom reference layer 112. As with the in-plane top reference layer 109 of the embodiment shown in FIG. 10, the in-plane bottom reference layer 112 of this embodiment can help provide faster switching speeds by helping to initiate the switching operation.

Each of FIGS. 7 through 11 illustrated a DMTJ structure constructed according to principles of the present inventive concepts. Various single barrier layer MTJ structures are also contemplated within the scope of the present inventive principles, a few embodiments of which will be described with reference to FIGS. 12 through 14.

Figure 12:
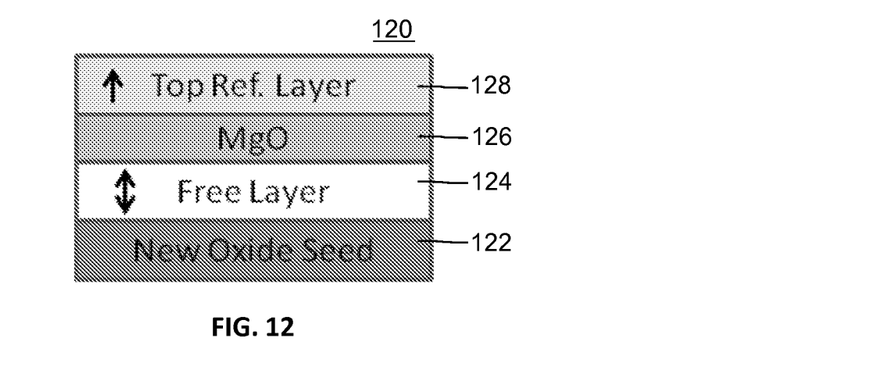
FIG. 12 is a schematic representation of a magnetic memory element having a seed layer formed from one or more of the new oxide materials according to still further principles of the present inventive concepts.

FIG. 12 illustrates a magnetic element (or a magnetic stack structure) 120 in which one or more of the new oxide materials can be used as a seed layer 122 with a free layer 124 formed thereon. An MgO tunneling barrier layer 126 separates the free layer 124 from a pinned layer (or a top reference layer) 128. In this particular embodiment, both the free layer 124 and the top reference layer 128 have perpendicular magnetic orientations. As mentioned previously, perpendicular magnetic orientations can enable smaller device structures. For perpendicular single tunneling barrier layer structures, the switching may be achieved through fast nucleation of domains when the activation volume of the free layer is less than the total volume as discussed in more detail in Applied Physics Letters, Vol. 99, 042501 (2001), and IEEE Magnetics Letters, Vol. 2, 3000204 (2011).

Figure 13:
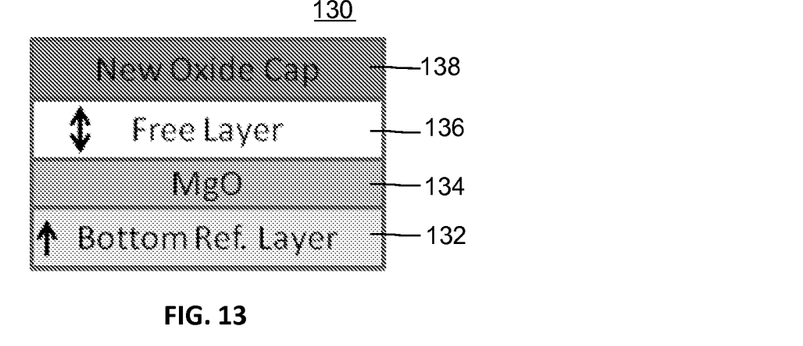
FIG. 13 is a schematic representation of a magnetic memory element having a capping layer formed from one or more of the new oxide materials according to additional principles of the present inventive concepts.

FIG. 13 illustrates a magnetic element or (a magnetic stack structure or MTJ) 130 in which a capping layer 138 formed from one or more of the new oxide materials may be provided. The capping layer 138 may be arranged over the free layer 136, and the free layer 136 may be separated from a pinned layer (or a bottom reference layer) 132 by an MgO tunneling barrier layer 134. In this embodiment, the free layer 136 and the bottom reference layer 132 both may have perpendicular magnetic orientations.

Figure 14:
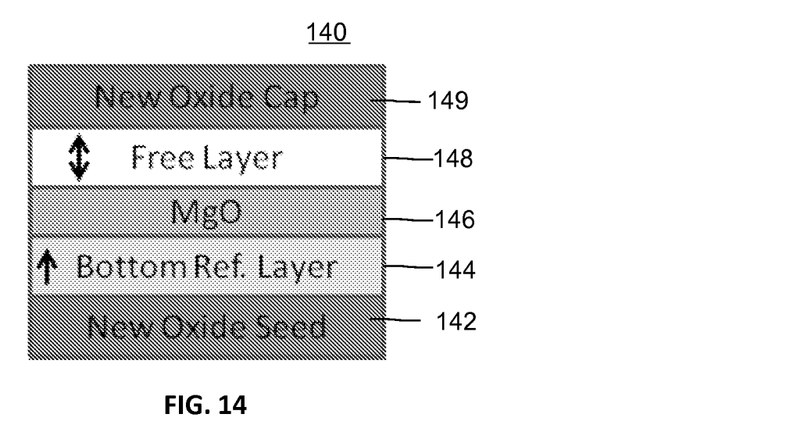
FIG. 14 is a schematic representation of a magnetic memory element having a capping layer and a seed layer formed from one or more of the new oxide materials according to further principles of the present inventive concepts.

FIG. 14 illustrates another magnetic element (or a magnetic stack structure) 140 constructed according to principles of the present inventive concepts. As shown in FIG. 14, a seed layer 142 can be formed from one or more of the new oxide materials disclosed herein. A pinned layer (or a bottom reference layer) 144 can be formed on the seed layer 142. A free layer 148 can be provided and separated from the bottom reference layer 144 by an MgO tunneling barrier layer 146. And finally, a capping layer 149 can be formed from one or more of the new oxide materials and arranged above the free layer 148. In this particular embodiment, both the free layer 148 and the bottom reference layer 144 can have perpendicular magnetic orientations.

Figure 15:
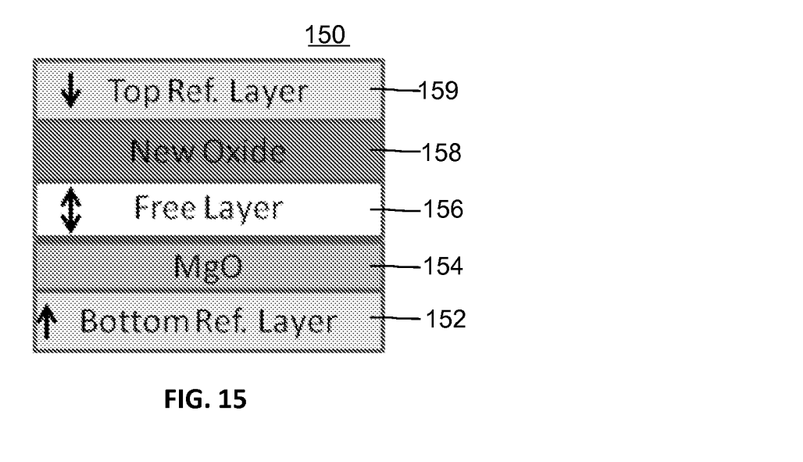
FIG. 15 is a schematic representation of a magnetic memory element having substantially perpendicularly magnetized free and reference layers and further having a barrier layer formed from one or more of the new oxide materials according to principles of the present inventive concepts.

FIG. 15 illustrates a magnetic element or DMTJ magnetic stack structure 150 similar to that shown in FIG. 8, except that each of the magnetic layers have a perpendicular magnetic orientation, More particularly, as illustrated in FIG. 15, a pinned layer (or a top reference layer) 159 can be arranged above a free layer 156 with a non-magnetic spacer layer or a tunneling barrier layer 158 arranged therebetween. The spacer layer 158 can be formed from one or more of the new oxide materials disclosed herein. Another pinned layer (or a bottom reference layer 152) can be arranged below the free layer 156 with an MgO tunneling barrier layer 154 disposed between the free layer 156 and the bottom reference layer 152. Each of the reference layers 152, 159 and the free layer 156 can have a perpendicular magnetic orientation, with the magnetic orientation of the top reference layer 159 preferably arranged opposite that of the bottom reference layer 152. As discussed previously, perpendicular magnetic orientations can enable smaller device structures, and fast switching may be possible when the activation volume is less than the total volume of the free layer.

Figure 16:
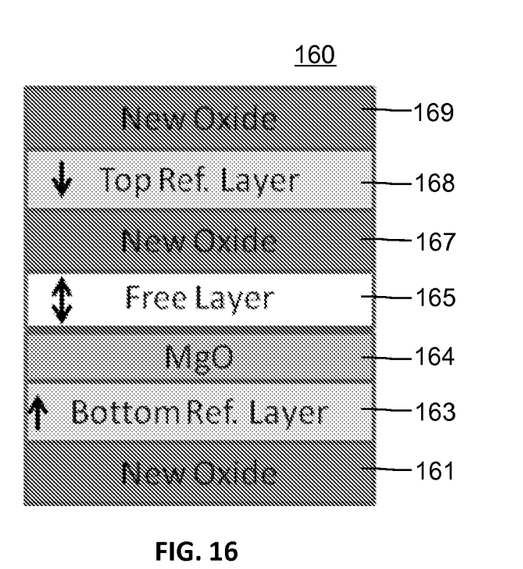
FIG. 16 is a schematic representation of a magnetic memory element having substantially perpendicularly magnetized reference and free layers, further illustrating the use of one or more of the new oxide materials as a capping layer, barrier layer, and/or seed layer according to further principles of the present inventive concepts.

Referring now to FIG. 16, a magnetic element (or a magnetic stack structure or MTJ) 160 according to yet another embodiment can include a seed layer 161 formed from one or more of the new oxide materials, a pinned layer (or a bottom reference layer) 163 arranged on the seed layer 161, an MgO tunneling barrier layer 164 arranged between the bottom reference layer 163 and a free layer 165, a non-magnetic spacer layer or a tunneling barrier layer 167 formed from one of the new oxide materials arranged between the free layer 165 and another pinned layer (or a top reference layer) 168, and a capping layer 169 formed from one of the new oxide materials arranged above the top reference layer. Each of the free and reference layers can have a perpendicular magnetic orientation with the top and bottom reference layers 163, 168 having magnetic orientations in opposite directions.

Figure 17:
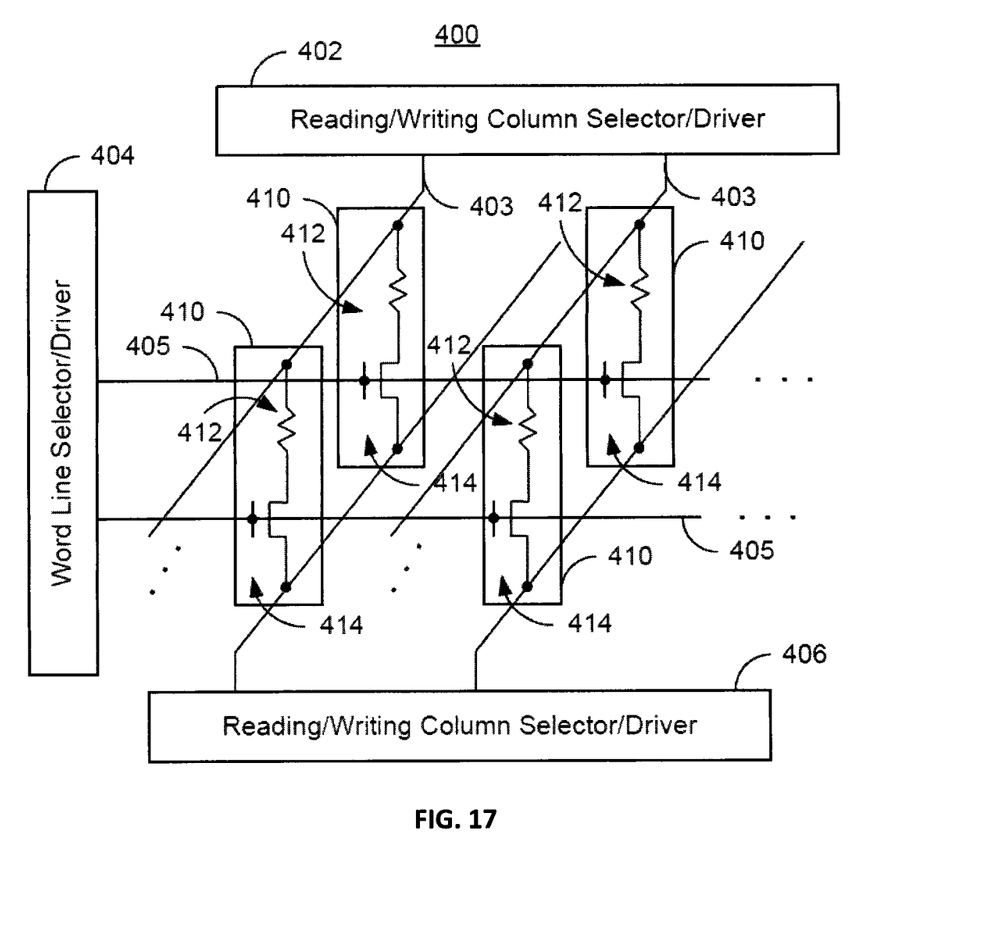
FIG. 17 depicts an exemplary embodiment of a magnetic memory utilizing a magnetic element according to some embodiments of the present disclosure.

FIG. 17 depicts an exemplary embodiment of a portion of a magnetic memory 400 utilizing a magnetic element discussed above. In the embodiment shown, the magnetic memory may be a STT-RAM 400. The STT-RAM 400 includes reading/writing column selector/drivers 402 and 406 as well as word line selector/driver 404. The STT-RAM 400 also includes memory cells 410 including a magnetic element 412 and a selection/isolation device 414. The magnetic element 412 may be any magnetic elements shown in FIGS. 7 through 16. The reading/writing column selector/drivers 402 and 406 may be used to selectively drive current through the bit lines 403 and thus the cells 410. The word line selector/driver 404 selectively enables row(s) of the STT-RAM 400 by enabling the selection/isolation device 414 coupled with the selected word line 405. In the embodiment shown, the additional magnetic field used in writing may be provided by the bit lines 403.

Referring back to FIG. 17, according to further principles of the present inventive concepts, a circuit structure as shown in FIG. 17 can be formed using magnetic memory elements which include binary, ternary, or multi-nary alloy oxides as seed, capping, or barrier layers to improve their performance characteristics at reduced memory cell sizes, faster writing and reading speeds, and reduced reading and writing random errors.

Figure 18:
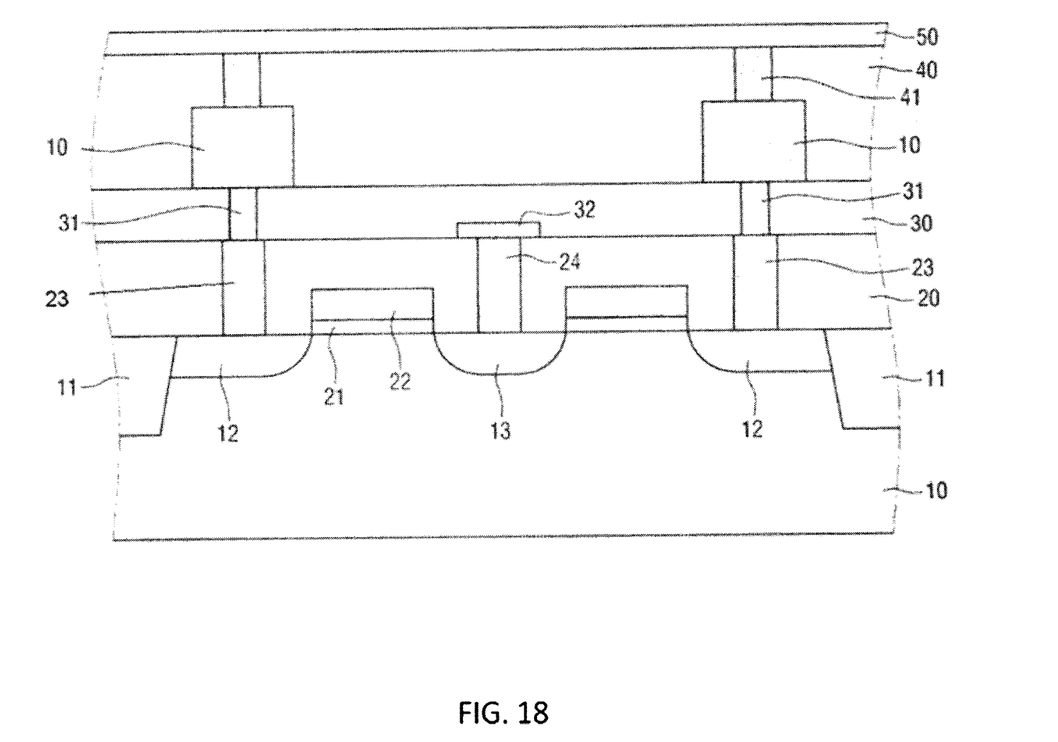
FIG. 18 is a schematic cross-sectional view of a magnetic device including an MTJ element constructed according to principles of the present disclosure.

Referring to FIG. 18, access devices are arranged in a predetermined region of a substrate 10.

The substrate 10 may be a silicon substrate, a gallium arsenide substrate, a silicon germanium substrate, a ceramic substrate, a quartz substrate, or a glass substrate for display, and may be an SOI (Silicon On Insulator) substrate. In this case, the access devices may be MOS transistors. In this case, the access transistors are arranged in an active region that is defined by a device isolation film 11 formed in a predetermined region of the substrate 10. Specifically, the access transistor is arranged in the active region, and may include a source region 13 and a drain region 12, which are spaced apart from each other, and a gate electrode 22 that is formed on an upper portion of a channel region between the source region 13 and the drain region 12. The gate electrode 22 may extend to cross the upper portion of the active region to serve as a word line. The gate electrode 22 is insulated from the active region by a gate insulating film 21.

A first interlayer insulating film 20 is formed on the upper portion of the substrate 10 having the access transistors, and a source line 32 may be arranged on a predetermined region of the first interlayer insulting film 20 that corresponds to the source region 13. The source line 32 may be formed to extend in the same direction as the gate electrode 22. A source line contact 24 and a landing contact 23 are formed in the first interlayer insulating film 20. The source line contact 24 electrically connects the source line 32 and the source region 13, and the landing contact 23 may be formed on the drain region 12 to electrically connect an MTJ element to the drain region 12 of the access transistors.

A second interlayer insulating film 30 may be formed on the first interlayer insulating film 20 on which the source line 32 may be arranged. In the second interlayer insulating film 30, a lower electrode contact 31 that is electrically connected to the landing contact 24 may be formed.

An MTJ element 10 according some embodiments of the present disclosure discussed above, for example, with respect to FIGS. 7-16 may be arranged on electrode contact 31 and/or the second interlayer insulating film 30. Since the magnetic tunnel junction element 10 is described above, the detailed description thereof will be omitted.

The magnetic tunnel junction element 10 and the drain region 12 are electrically connected through the landing contact 23 and the lower electrode contact 31.

A third interlayer insulating film 40 may be formed over the MTJ element 10. On the third interlayer insulating film 40, a bit line 50 may be arranged to cross the gate electrode 22. The bit line 50 and the magnetic tunnel junction element 100 are electrically connected through the upper electrode contact 41. In an alternative process, upper electrode contact 41 can be omitted.

The first, second, and third interlayer insulating films 20, 30, and 40, for example, may be formed of a silicon oxide film or a silicon nitride oxide film. The landing contact 23, the source line contact 24, the source line 32, the lower electrode contact 31, the upper electrode contact 41, and the bit line 50 may be formed, for example, using W, Ru, Ta, Cu, Al, or doped polysilicon.

On the bit line 50, conductive wires for electrical contact with circuits of a peripheral circuit portion (not illustrated) may be further formed.

Figure 19:
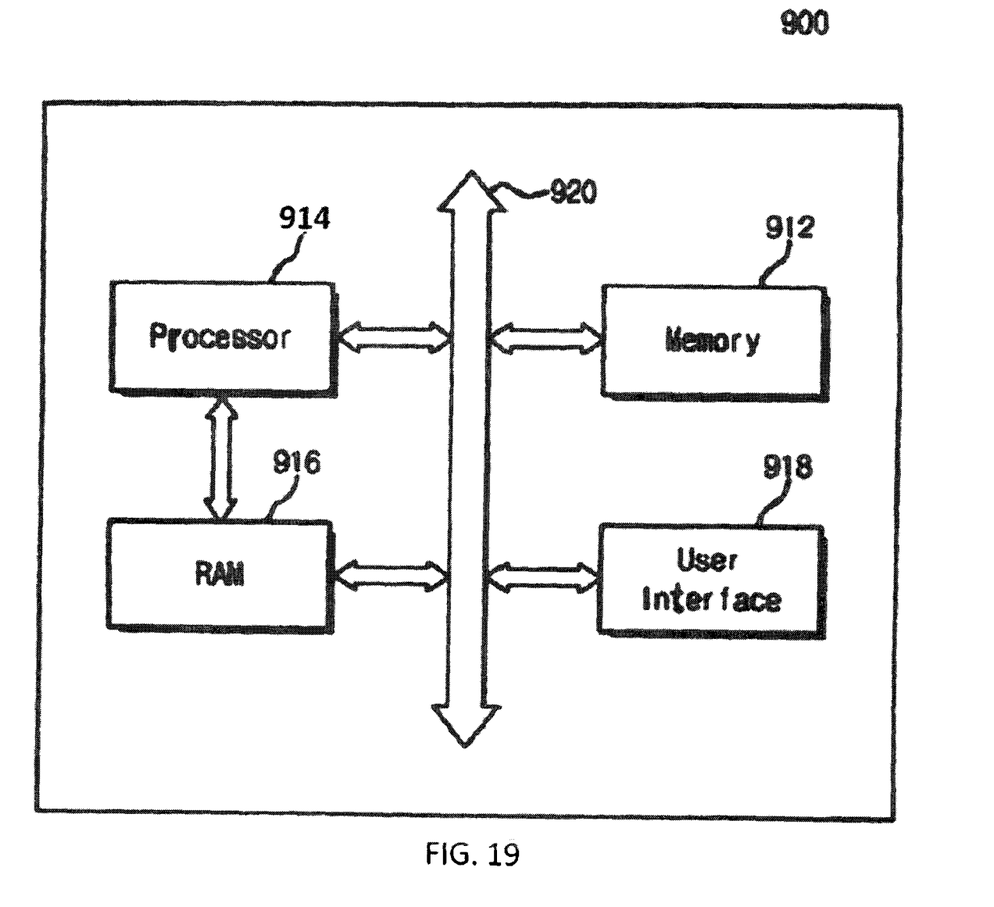
FIG. 19 is a schematic view of an electronic system in which the magnetic element device according to some embodiment of the inventive concept described above is used.

FIG. 19 is a schematic view of an electronic system 900 in which the magnetic element device according to some embodiment of the inventive concept described above may be used. The electronic system 900 may be used for a wide variety of electronic devices such as a computer including, but not limited to, a portable notebook computer, Ultra-Mobile PCs (UMPC), Tablet PCs, a server, workstation, a mobile telecommunication device, satellite, set top box, TV and so on. For example, the electronic system 900 may include a memory system 912, a processor 914, RAM 916, and a user interface 918, which may execute data communication using a bus 920. The memory system 912 may include a magnetic device according some embodiments of the present application discussed above. The processor 914 may be a microprocessor or a mobile processor (AP). The processor 914 may have a processor core (not illustrated) that can include a floating point unit (FPU), an arithmetic logic unit (ALU), a graphics processing unit (GPU), and a digital signal processing core (DSP Core), or any combinations thereof. The processor 914 may execute the program and control the electronic system 900. The RAM 916 may be used as an operation memory of the processor 914. For example, the processor 914 or the RAM 916 may include a magnetic device according to example embodiments described above. Alternatively, the processor 914 and the RAM 916 may be packaged in a single package body. The user interface 918 may be used in inputting/outputting data to/from the electronic system 900. The memory system 912 may store codes for operating the processor 914, data processed by the processor 914, or externally input data. The memory system 912 may include a controller and a memory.

The electronic system 900 may be used in electronic controllers for a variety of electronic devices.

By constructing a magnetic stack structure having one or more of the new oxide materials as a seed layer, a capping layer, and/or a barrier or spacer layer, a higher TMR ratio can be provided along with a lower RA value and lower STT writing current density and voltage. In addition, higher interfacial perpendicular anisotropy can be achieved using these improved seed, capping, and insertion materials. The improved materials also provide for a greatly reduced probability of reading and writing errors along with a well established direction for switching and good selection characteristics.

For example, by forming one of the barrier layers using $MgTb_yO$ as the new $Mg_xA_yO_z$ binary oxide, high coherent tunneling can be achieved, enabling a high TMR ratio. In addition, a good crystal match can be obtained between the barrier layer and the magnetic pinned or free layer. Similarly, when $MgTb_yO$ (or one of the other new oxide materials) is used to form the seed or capping layer, a good lattice match between the crystal structures can be obtained and a lower RA value can be achieved. This is, because Tb associates with O preferably, thus causing fewer oxygen atoms to be associated with Mg, resulting in lower barrier height and lower RA value.

In the embodiments shown, MgO may be generally used as one of the barrier layers, with one of the new oxide materials being used as a second barrier layer, a capping layer, or a seed layer. However, the principles of the present application may also be applied when barrier materials other than MgO are used. If new oxide materials are used to provide two or more barrier layers, one of the new oxide material layers should preferably have an RA value of at least one order of magnitude higher than the other new oxide material barrier layer. Because cancellation depends on the RA values, if the RA values are too similar it may be difficult to effectively read from the device. In alternative embodiments, therefore, the main tunneling barrier can be made from any one or more of the new class of oxides.

In some embodiments, methods of writing to these devices can include using bipolar or unipolar current (or voltage) flowing through the MTJ devices to cause switching. A method of writing could alternatively include using bipolar or unipolar current (or voltage) flowing through the MTJ devices in conjunction with an assisting pulsing current adjacent the MTJ devices. In one embodiment, the assisting pulsing current can couple to the MTJ through magnetic fields. In another embodiment, the assisting pulsing current can cause spin currents or spin torques onto the MTJ from physical effects such as Spin Hall Effect, or Rashba effect. The assisting pulsing current can lead, and/or overlap the current (or voltage) flowing through the MTJ. These methods can help produce faster switching with lower writing error rates.

In particular, according to one embodiment, a magnetic memory which includes a plurality of magnetic storage cells (each of which including at least one magnetic element discussed above) as illustrated in FIG. 17, may be programmed by driving a bipolar or unipolar current through the at least one magnetic element or applying a voltage to at least one magnetic element. The bipolar or unipolar current or voltage may be sufficient to program the at least one magnetic element. Each of the plurality of magnetic storage cells may also include at least one selection device. The at least one magnetic element may thus be programmable by passing a write current through the at least one magnetic element or applying a voltage to the at least one magnetic element.

In another embodiment, a magnetic memory which includes a plurality of magnetic storage cells (including at least one magnetic element discussed above) as illustrated in FIG. 17, may be programmed by driving a first current near but not through the at least one magnetic element of a portion of the plurality of magnetic storage cells, e.g., driving a pulsing current in a conductive wire adjacent the at least one magnetic element and driving a second current through the at least one magnetic element or applying a voltage. The first current may generate a magnetic field or additional spin torque. The second current or voltage; and the magnetic field or additional spin torque may be sufficient to program the at least one magnetic element. With the above described embodiments of the present inventive concept, faster switching with lower error rates in the operation of magnetic memories can be realized. In other words, with the new oxide materials of the present inventive concepts, coupled with assisted writing discussed above, the fastest switching at even smallest memory cell sizes, e.g., sub-20 nanometer nodes, might be realized.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Various magnetic memory element structures, and methods and systems for providing a magnetic memory element and memory fabricated using the magnetic memory element have been described. Although the structures, methods, and systems have been described in accordance with exemplary embodiments, one of ordinary skill in the art will readily recognize that many variations to the disclosed embodiments are possible, and any variations should therefore be considered to be within the spirit and scope of the apparatus, method, and system disclosed herein. Accordingly, many modifications may be made by one of ordinary skill in the art without departing from the spirit and scope of the appended claims.

The invention claimed is:

1. A magnetic element for a semiconductor device, comprising:
 a first reference layer;
 a free layer;
 a first nonmagnetic spacer layer disposed between the first reference layer and the free layer; and
 a seed layer arranged beneath the first reference layer;
 wherein the seed layer comprises a binary, ternary, or multi-nary alloy oxide material,
 where the binary, ternary, or multi-nary alloy oxide material comprises MgO having one or more additional elements selected from the group consisting of: Ru, Al, Ta, Tb, Cu, V, Hf, Zr, W, Ag, Au, Fe, Co, Ni, Nb, Cr, Mo, and Rh.

2. The magnetic element of claim 1 wherein the first nonmagnetic spacer layer is an insulating tunneling barrier layer.

3. The magnetic element of claim 1 wherein the first nonmagnetic spacer layer comprises a conductive material to function as a spin valve.

4. The magnetic element of claim 1, further comprising a capping layer arranged over the first reference layer, said capping layer comprising a binary, ternary, or multi-nary alloy oxide material, where the binary, ternary, or multi-nary alloy oxide material comprises MgO having one or more additional elements selected from the group consisting of: Ru, Al, Ta, Tb, Cu, V, Hf, Zr, W, Ag, Au, Fe, Co, Ni, Nb, Cr, Mo, and Rh.

5. The magnetic element of claim 1 wherein the first nonmagnetic spacer layer comprises a (001) crystal structure.

6. The magnetic element of claim 1, further comprising a second reference layer arranged on an opposite side of the free layer, and a second nonmagnetic spacer layer arranged between the second reference layer and the free layer.

7. The magnetic element of claim 6 wherein the first nonmagnetic spacer layer comprises a binary, ternary, or multi-nary alloy oxide material,
wherein the binary, ternary, or multi-nary alloy oxide material comprises MgO having one or more additional elements selected from the group consisting of: Ru, Al, Ta, Tb, Cu, V, Hf, Zr, W, Ag, Au, Fe, Co, Ni, Nb, Cr, Mo, and Rh, and
wherein second nonmagnetic spacer layer comprises MgO.

8. The magnetic element of claim 6, wherein the free layer and the second reference layer have an in-plane magnetic orientation and the first reference layer has a perpendicular magnetic orientation.

9. The magnetic element of claim 6, wherein the free layer and the second reference layer have a perpendicular magnetic orientation and the first reference layer has an in-plane magnetic orientation.

10. The magnetic element of claim 6, further comprising a capping layer overlying the first reference layer, wherein the free layer and the second reference layer have an in-plane magnetic orientation and the first reference layer has a perpendicular magnetic orientation.

11. The magnetic element of claim 6, wherein the first reference layer is disposed below the second reference layer, and wherein the free layer and the second reference layer have a perpendicular magnetic orientation and the first reference layer has an in-plane magnetic orientation.

12. The magnetic element of claim 6 further comprising:
a capping layer arranged above the first reference layer;
wherein the capping layer is formed from a binary, ternary, or multi-nary alloy oxide material having a crystal structure that closely matches the first reference layer, where the binary, ternary, or multi-nary alloy oxide material comprises MgO having one or more additional elements selected from the group consisting of: Ru, Al, Ta, Tb, Cu, V, Hf, Zr, W, Ag, Au, Fe, Co, Ni, Nb, Cr, Mo, and Rh.

13. A magnetic element comprising:
a reference layer;
a free layer;
a nonmagnetic spacer layer disposed between the reference layer and the free layer;
a capping layer arranged above the reference layer; and
a seed layer arranged below the reference layer,
wherein the seed layer comprises a binary, ternary, or multi-nary alloy oxide material, where the binary, ternary, or multi-nary alloy oxide material comprises MgO having one or more additional elements selected from the group consisting of: Ru, Al, Ta, Tb, Cu, V, Hf, Zr, W, Ag, Au, Fe, Co, Ni, Nb, Cr, Mo, and Rh.

14. A magnetic element for a semiconductor device, comprising:
a reference layer;
a free layer; and
a nonmagnetic spacer layer disposed between the reference layer and the free layer;
wherein the nonmagnetic spacer layer comprises a binary, ternary, or multi-nary alloy oxide material,
where the binary, ternary, or multi-nary alloy oxide material comprises MgO having one or more additional elements A, wherein A is selected from the group consisting of: Ru, Al, Ta, Tb, Cu, V, Hf, Zr, W, Ag, Au, Fe, Co, Ni, Nb, Cr, Mo, and Rh,
wherein the binary alloy oxide material comprises $Mg_xA_yO_z$ where $x+y>1$ and $z<1$.

15. A magnetic element comprising:
a free layer having a magnetization direction that can be switched from one direction to an opposite direction;
a reference layer;
a spacer layer arranged between the free layer and the reference layer; and
a seed layer arranged adjacent to the reference layer, wherein the seed layer comprises a binary, ternary, or multi-nary alloy oxide material having one or more additional elements and a crystal structure that closely matches a crystal structure of the adjacent reference layer,
wherein the one or more additional elements are selected from the group consisting of: Ru, Al, Ta, Tb, Cu, V, Hf, Zr, W, Ag, Au, Fe, Co, Ni, Nb, Cr, Mo, and Rh.

16. The magnetic element of claim 15, wherein the binary, ternary, or multi-nary alloy oxide material comprises Mg, O, and one or more additional elements to reduce the resistance of the oxide material as compared to MgO.

17. The magnetic element of claim 15, wherein the spacer layer is a tunneling barrier layer.

18. The magnetic element of claim 17, wherein the tunneling barrier layer comprises a binary, ternary, or multi-nary alloy oxide material having a crystal structure that closely matches crystal structures of the adjacent free layer and reference layer.

19. The magnetic memory storage element of claim 15, wherein the magnetic memory storage element provides a spin valve structure.

20. A magnetic element for a semiconductor device, comprising:
a reference layer;
a free layer;
a nonmagnetic spacer layer disposed between the reference layer and the free layer; and
a seed layer arranged beneath the reference layer,
wherein the seed layer comprises a binary, ternary, or multi-nary alloy oxide material,
where the binary, ternary, or multi-nary alloy oxide material comprises MgO having one or more additional elements A, wherein A is selected from the group consisting of: Ru, Al, Ta, Tb, Cu, V, Hf, Zr, W, Ag, Au, Fe, Co, Ni, Nb, Cr, Mo, and Rh,
wherein the binary alloy oxide material comprises $Mg_xA_yO_z$ where $x+y+z=1$, $x>y$ and $0<x$, or y, or $z<1$, wherein the ternary alloy oxide comprises $Mg_xA^1_{y1}A^2_{y2}O_z$ where $x+y1+y2+z=1$, $x>y1+y2$ and $0<x$, or $y1$, or $y2$, or $z<1$, and wherein the multi-nary alloy oxide comprises $Mg_xA^1_{y1}A^2_{y2}\ldots A^n_{yn}O_z$ where $x+y1+y2+\ldots+yn+z=1$, $x>y1+y2+\ldots+yn$ and $0<x$, or $y1$, or $y2$, $\ldots$, or $yn$, or $z<1$.

21. A magnetic element for a semiconductor device, comprising:
- a reference layer;
- a free layer;
- a nonmagnetic spacer layer disposed between the reference layer and the free layer;
- a capping layer overlying the free layer; and
- wherein at least one of the nonmagnetic spacer layer or the capping layer comprises a ternary, or multi-nary alloy oxide material,
- where the ternary or multi-nary alloy oxide material comprises MgO having one or more additional elements A, wherein A is selected from the group consisting of: Ru, Al, Ta, Tb, Cu, V, Hf, Zr, W, Ag, Au, Fe, Co, Ni, Nb, Cr, Mo, and Rh,
- wherein the ternary alloy oxide comprises $Mg_xA^1_{y1}A^2_{y2}O_z$ where $x+y1+y2+z=1$, $x>y1+y2$ and $0<x$, or $y1$, or $y2$, or $z<1$, and
- wherein the multi-nary alloy oxide comprises $Mg_xA^1_{y1}A^2_{y2}\ldots A^n_{yn}O_z$ where $x+y1+y2+\ldots+yn+z=1$, $x>y1+y2+\ldots+yn$ and $0<x$, or $y1$, or $y2$, $\ldots$, or $yn$, or $z<1$.

22. A magnetic element comprising:
- a reference layer;
- a free layer;
- a nonmagnetic spacer layer disposed between the reference layer and the free layer;
- a capping layer overlying the free layer; and
- a seed layer arranged below the reference layer,
- wherein at least one of the nonmagnetic spacer layer, the capping layer or the seed layer comprises a ternary, or multi-nary alloy oxide material,
- where the ternary or multi-nary alloy oxide material comprises MgO having one or more additional elements A, wherein A is selected from the group consisting of: Ru, Al, Ta, Tb, Cu, V, Hf, Zr, W, Ag, Au, Fe, Co, Ni, Nb, Cr, Mo, and Rh,
- wherein the ternary alloy oxide comprises $Mg_xA^1_{y1}A^2_{y2}O_z$ where $x+y1+y2+z=1$, $x>y1+y2$ and $0<x$, or $y1$, or $y2$, or $z<1$, and
- wherein the multi-nary alloy oxide comprises $Mg_xA^1_{y1}A^2_{y2}\ldots A^n_{yn}O_z$ where $x+y1+y2+\ldots+yn+z=1$, $x>y1+y2+\ldots+yn$ and $0<x$, or $y1$, or $y2$, $\ldots$, or $yn$, or $z<1$.

23. The magnetic element of claim 13, wherein the seed layer comprises $MgAl_2O_4$, (Mg, Ca, Sr, Ba, Mg)$SnO_3$, $Mg_2SnO_4$, or $NiMn_2O_4$.

* * * * *